US012672535B2

(12) United States Patent (10) Patent No.: US 12,672,535 B2
Katakam et al. (45) Date of Patent: Jun. 30, 2026

(54) ENLARGED SHALLOW TRENCH ISOLATION FOR BACKSIDE POWER

(71) Applicant: INTERNATIONAL BUSINESS MACHINES CORPORATION, Armonk, NY (US)

(72) Inventors: Shravana Kumar Katakam, Lehi, UT (US); Tao Li, Slingerlands, NY (US); Kisik Choi, Watervliet, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 698 days.

(21) Appl. No.: 18/066,620

(22) Filed: Dec. 15, 2022

(65) Prior Publication Data

US 2024/0203878 A1 Jun. 20, 2024

(51) Int. Cl.
*H10W 20/41* (2026.01)
*H10W 20/00* (2026.01)

(52) U.S. Cl.
CPC ..... *H10W 20/427* (2026.01); *H10W 20/0698* (2026.01)

(58) Field of Classification Search
CPC ........... H10W 20/427; H10W 20/0698; H10W 20/0245; H10W 20/481; H10W 20/023; H10D 30/6735; H10D 30/6757
See application file for complete search history.

(56) References Cited

U.S. PATENT DOCUMENTS

| | | | |
|---|---|---|---|
| 9,570,395 B1 | 2/2017 | Sengupta et al. | |
| 10,586,765 B2 | 3/2020 | Smith et al. | |
| 10,636,739 B2 | 4/2020 | Beyne et al. | |
| 10,700,207 B2 | 6/2020 | Chen et al. | |
| 10,957,575 B2 | 3/2021 | Yakimets et al. | |
| 11,094,594 B2 | 8/2021 | Tsao | |
| 11,133,254 B2 | 9/2021 | Lai et al. | |
| 11,289,602 B2 | 3/2022 | Chiang et al. | |
| 2020/0105671 A1 | 4/2020 | Lai et al. | |
| 2020/0373331 A1* | 11/2020 | Kim | H10D 86/201 |
| 2021/0351079 A1 | 11/2021 | Su et al. | |
| 2022/0098919 A1* | 3/2022 | Baizeau | E06B 1/34 |
| 2023/0067354 A1* | 3/2023 | Wei | H01L 21/0259 |
| 2024/0105728 A1* | 3/2024 | Liang | H10D 30/6757 |
| 2024/0105797 A1* | 3/2024 | Liang | B82Y 10/00 |

OTHER PUBLICATIONS

Gupta et al., "Buried Power Rail Integration with Si FinFETs for CMOS Scaling beyond the 5 nm Node", In2020 IEEE Symposium on VLSI Technology Jun. 16, 2020 (pp. 1-2).
Ryckaert et al., "Extending the roadmap beyond 3nm through system scaling boosters: A case study on Buried Power Rail and Backside Power Delivery", In2019 Electron Devices Technology and Manufacturing Conference (EDTM) Mar. 12, 2019 (pp. 50-52).

* cited by examiner

*Primary Examiner* — Dao H Nguyen

(74) *Attorney, Agent, or Firm* — Harrity & Harrity, LLP

(57) ABSTRACT

Semiconductor devices and methods of forming the same include a first semiconductor device in a first device region and a second semiconductor device in a second device region. A dielectric structure between the first device region and the second device region laterally extends part way underneath the first semiconductor device and the second semiconductor device. A buried power rail is under the dielectric structure. A conductive via penetrates the dielectric structure to connect the first semiconductor device to the buried power rail.

17 Claims, 7 Drawing Sheets

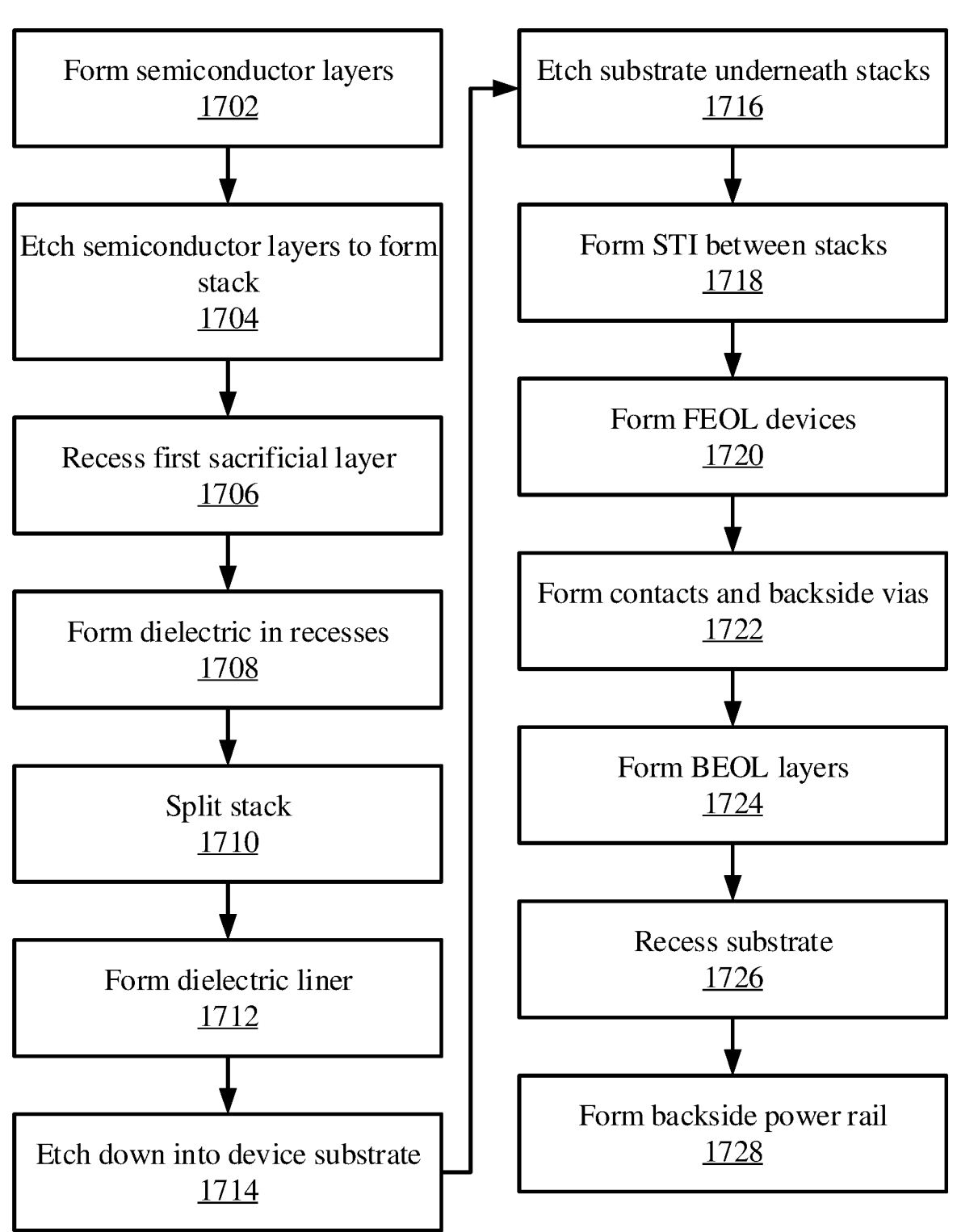

Form semiconductor layers
1702

Etch semiconductor layers to form stack
1704

Recess first sacrificial layer
1706

Form dielectric in recesses
1708

Split stack
1710

Form dielectric liner
1712

Etch down into device substrate
1714

Etch substrate underneath stacks
1716

Form STI between stacks
1718

Form FEOL devices
1720

Form contacts and backside vias
1722

Form BEOL layers
1724

Recess substrate
1726

Form backside power rail
1728

FIG. 17

ENLARGED SHALLOW TRENCH ISOLATION FOR BACKSIDE POWER

BACKGROUND

The present invention generally relates to semiconductor device fabrication and, more particularly, to semiconductor devices with backside power distribution networks.

Forming backside power distribution structures can include the removal of a substrate layer after the formation of active devices in a front-end-of-line (FEOL) layer. The removal of the substrate can damage neighboring structures, including the gate dielectric and source/drain contact vias.

SUMMARY

A semiconductor device includes a first semiconductor device in a first device region and a second semiconductor device in a second device region. A dielectric structure between the first device region and the second device region laterally extends part way underneath the first semiconductor device and the second semiconductor device. A buried power rail is under the dielectric structure. A conductive via penetrates the dielectric structure to connect the first semiconductor device to the buried power rail.

A semiconductor device includes a first semiconductor device in a first device region and a second semiconductor device in a second device region. A dielectric structure between the first device region and the second device region laterally extends part way underneath the first semiconductor device and the second semiconductor device. A buried power rail is under the dielectric structure. A conductive via penetrates the dielectric structure to connect the first semiconductor device to the buried power rail. A back-end-of-line layer over the first semiconductor device and the second semiconductor device includes a conductive via to connect to the second semiconductor device.

A method of forming a semiconductor device includes etching down into a semiconductor layer to form a cavity between a first device region and a second device region. The cavity extends laterally underneath the first device region and the second device region. Dielectric material is deposited in the cavity to form a dielectric isolation structure between the first device region and the second device region. A conductive via that contacts a first semiconductor device is formed in the first device region and penetrates the dielectric isolation structure. A power rail is formed that makes electrical contact with the conductive via, underneath the dielectric isolation structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 17 is a block/flow diagram of a method for fabricating a semiconductor device with an enlarged STI structure, in accordance with an embodiment of the present invention.

DETAILED DESCRIPTION

Forming devices with backside power distribution provides options for signal routing and power that can simplify device layout. The FEOL devices may be formed first, with shallow trench isolation (STI) structures being formed in a semiconductor substrate to prevent electrical shorting between neighboring devices. When the backside power distribution network is formed, however, the semiconductor substrate may be removed and new layers of dielectric may be formed on the backside of the FEOL layer. This process makes it possible to form new conductive lines and vias in the backside dielectric layers, but the removal of the substrate underlying the FEOL layer may cause damage to FEOL structures, such as gate stacks and source/drain contact vias.

To address this, the STI structures may be formed in multiple stages. In a first stage, STI structures may be formed between stacks of semiconductor layers that define stack regions. The stacks may then be split into separate device regions by through a center portion. An etch may be applied that cuts into the underlying substrate to create a gap between the devices, and that gap may be widened underneath the stacks. A second STI may then be formed between the device regions, with the STI structure extending at least partially underneath the respective device stacks. This enlarged STI region can help to protect device structures and contacts when the substrate is removed.

Figures 1, 2, 3:
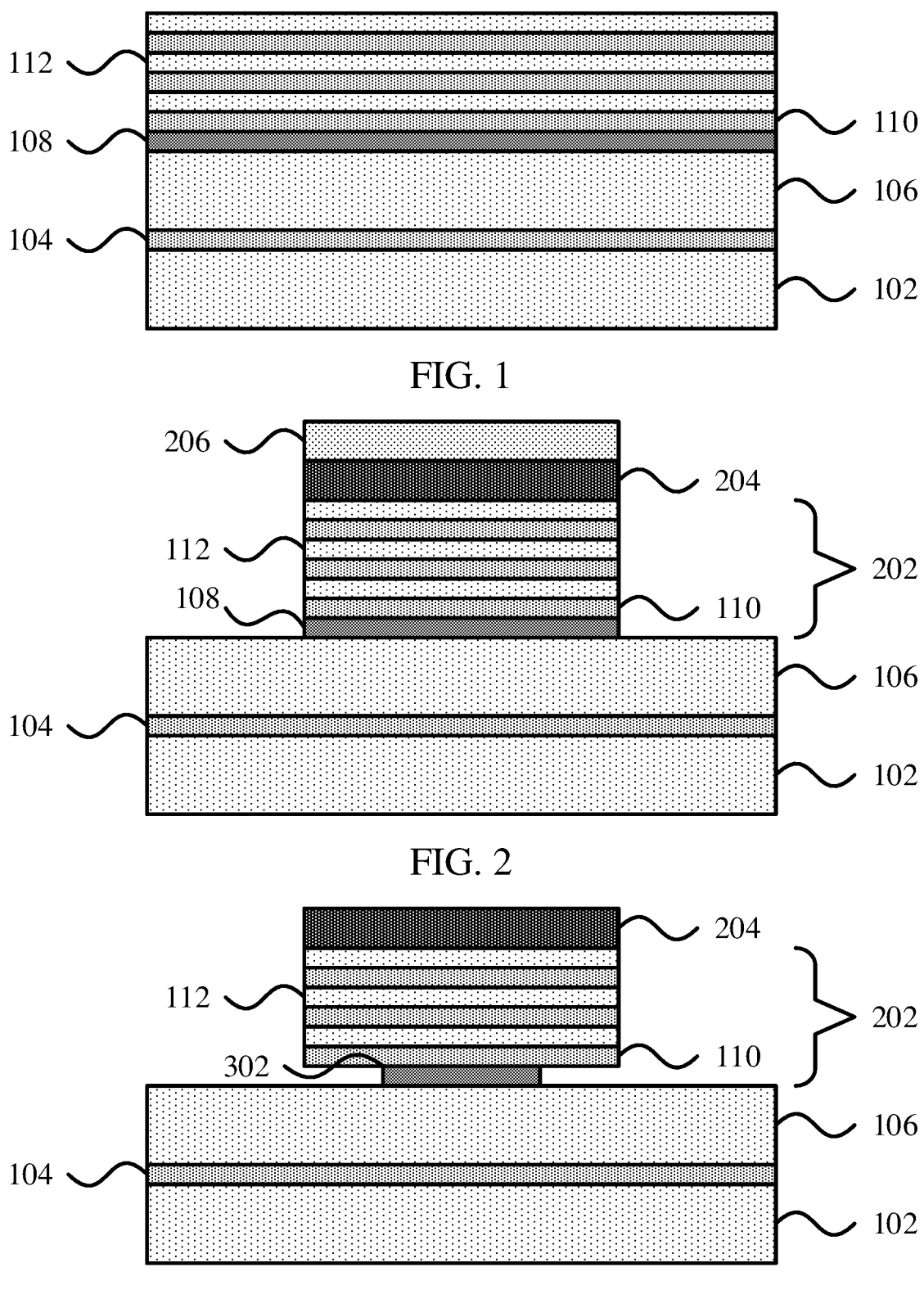
FIG. 1 is a cross-sectional view of a step in the fabrication of a semiconductor device with an enlarged shallow trench isolation (STI) structure, showing the formation of a series of semiconductor layers on a substrate, in accordance with an embodiment of the present invention.
FIG. 2 is a cross-sectional view of a step in the fabrication of a semiconductor device with an enlarged STI structure, showing the etch of the series of semiconductor layers into a stack, in accordance with an embodiment of the present invention.
FIG. 3 is a cross-sectional view of a step in the fabrication of a semiconductor device with an enlarged STI structure, showing the partial isotropic etch of a bottommost semiconductor layer in the stack to form an undercut, in accordance with an embodiment of the present invention.

Referring now to FIG. 1, a cross-sectional view of a step in the fabrication of a semiconductor device is shown. A stack of layers is formed on a bulk semiconductor substrate 102. These layers are processed over subsequent steps to form a semiconductor device, such as a stacked nanosheet field effect transistor (FET). While the nanosheet FET is described in particular detail, it should be understood that the present embodiments may also apply to other types of semiconductor device, including nanowire FETs, fin FETs, etc.

An etch stop layer 104 is formed on the bulk semiconductor substrate 102. The etch stop layer is formed from a material that has etch selectivity with respect to the material of the bulk semiconductor substrate 102. For example, if the bulk semiconductor substrate is formed from silicon, then the etch stop layer 104 may be formed from silicon germanium with an exemplary germanium concentration of about 30%. The etch stop layer 104 may be formed on the bulk semiconductor layer with an epitaxial growth process, and may have a thickness that is lower than the thickness that would cause discontinuities due to differences in the crystalline structure of the material of the etch stop layer 104 and the bulk semiconductor substrate 102.

A device substrate 106 is formed on the etch stop layer, for example by an epitaxial growth process. The device substrate 106 may be formed from the same semiconductor material as the bulk semiconductor substrate 102, or may be formed from any other appropriate semiconductor material.

A first sacrificial layer 108 is formed on the device substrate 106, for example by an epitaxial growth process. The first sacrificial layer 108 may be formed from, e.g., silicon germanium with an exemplary germanium concentration of about 60%. A stack of alternating semiconductor layers may be formed on the first sacrificial layer 108, for example including second sacrificial layers 110 and channel layers 112, for example by successive epitaxial growth processes. The second sacrificial layers 110 may be formed from a semiconductor material having etch selectivity with respect to the first sacrificial layer 108, such as silicon germanium with an exemplary germanium concentration of about 30%. The channel layers 112 may be formed from a semiconductor material having etch selectivity with respect to the first sacrificial layer 108 and the second sacrificial layers 110. It should be understood that the stack of layers may have any number of alternating second sacrificial layers 110 and channel layers 112.

In one example, the bulk-semiconductor substrate 102 may be a silicon-containing material. Illustrative examples of silicon-containing materials suitable for the bulk-semiconductor substrate include, but are not limited to, silicon, silicon germanium, silicon germanium carbide, silicon carbide, epitaxial silicon, and multi-layers thereof. Although silicon is the predominantly used semiconductor material in wafer fabrication, alternative semiconductor materials can be employed, such as, but not limited to, germanium.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

As used herein, the term "selective" in reference to a material removal process denotes that the rate of material removal for a first material is greater than the rate of removal for at least another material of the structure to which the material removal process is being applied. Thus for example, the material of the first sacrificial layer 108 may be selectively removed without removing the second sacrificial layers 110 or the channel layers 112, and the second sacrificial layers 110 may be selectively removed without removing the channel layers 112.

Referring now to FIG. 2, a cross-sectional view of a step in the fabrication of a semiconductor device is shown. A stack 202 may be formed from the layers of semiconductor material, for example by forming a hardmask pattern 204 on the layers and then anisotropically etching the exposed semiconductor layers using one or more etches. The hardmask pattern 204 may be formed by any appropriate photolithographic process, for example forming an organic planarizing layer 206 on a layer of hardmask material, and then etching away exposed portions of the hardmask material. The etch may remove all of the exposed first semiconductor layer 108 or may leave a portion of that first sacrificial material on the surface of the device substrate 106.

Reactive Ion Etching (RIE) is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Referring now to FIG. 3, a cross-sectional view of a step in the fabrication of a semiconductor device is shown. A selective isotropic etch is performed to remove material from the first sacrificial layer 108, producing recessed first sacrificial layer 302. The isotropic etch may be timed to prevent a complete removal of material from the first sacrificial layer 108.

Figures 4, 5, 6:
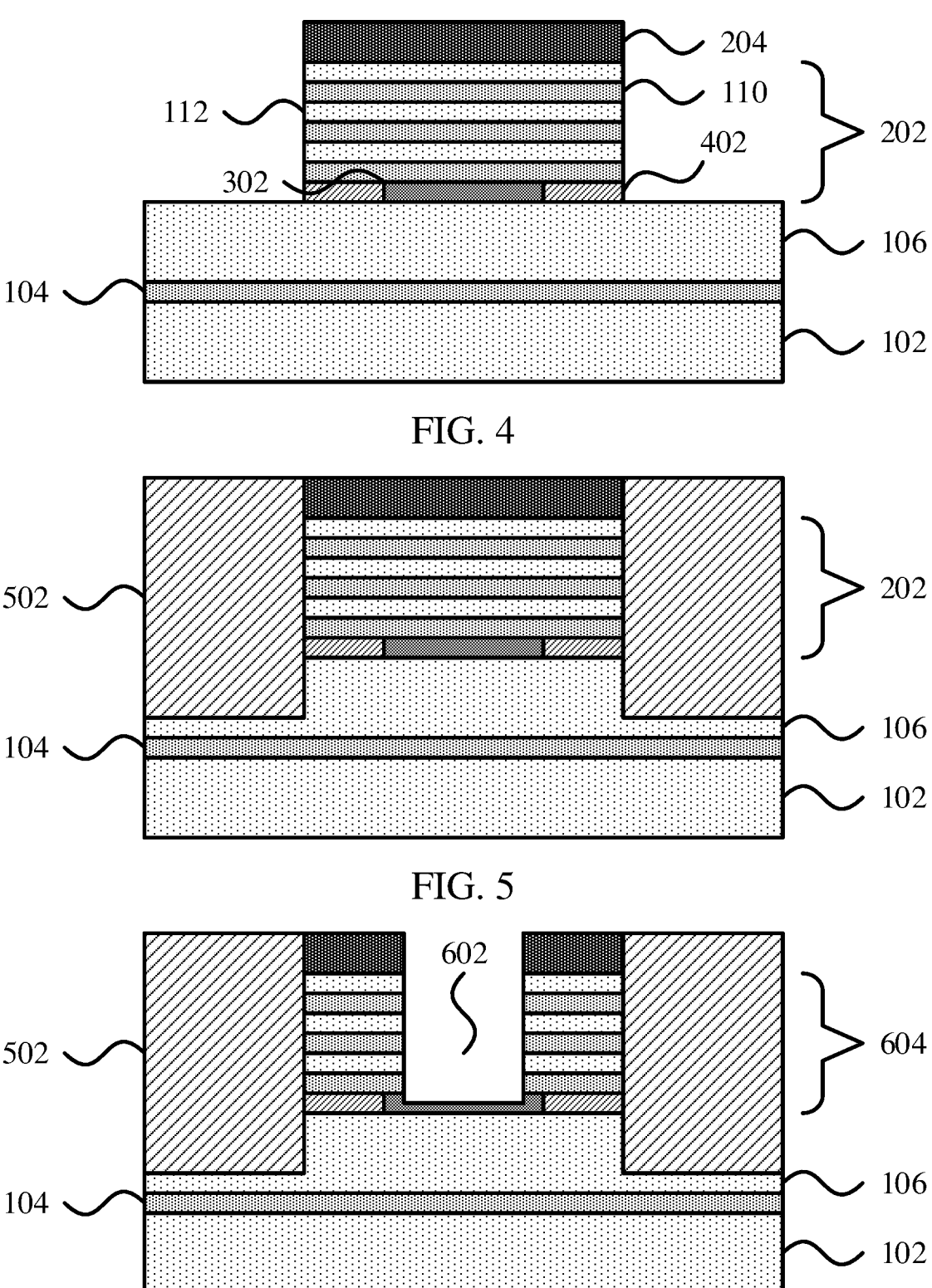
FIG. 4 is a cross-sectional view of a step in the fabrication of a semiconductor device with an enlarged STI structure, showing the formation of dielectric layer in the undercut, in accordance with an embodiment of the present invention.
FIG. 5 is a cross-sectional view of a step in the fabrication of a semiconductor device with an enlarged STI structure, showing the formation of a dielectric layer around the stack, in accordance with an embodiment of the present invention.
FIG. 6 is a cross-sectional view of a step in the fabrication of a semiconductor device with an enlarged STI structure, showing the separation of the stack into a first device region and a second device region by an anisotropic etch through the middle, in accordance with an embodiment of the present invention.

Referring now to FIG. 4, a cross-sectional view of a step in the fabrication of a semiconductor device is shown. A layer of dielectric material may be deposited using any appropriate deposition process, for example using a chemical vapor deposition (CVD) or atomic layer deposition (ALD) process to conformally deposit silicon nitride to fill the recesses left by isotropically etching the first sacrificial layer. After depositing the dielectric material, portions of dielectric material outside of the recesses may be etched away, for example using a timed isotropic etch or using a selective anisotropic etch that removes any material not covered by the stack of semiconductor layers 202.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use ALD, chemical precursors react with the surface of a material one at a time to deposit a thin film on the surface.

Referring now to FIG. 5, a cross-sectional view of a step in the fabrication of a semiconductor device is shown. A selective anisotropic etch is used to etch down into the device substrate 106. The depth of the etch may extend down to the etch stop layer 104, or may leave some semiconductor material remaining over the etch stop layer 104. A layer of dielectric may then be deposited to fill in the volume around the stack 202, for example using a flowable CVD of silicon dioxide. Excess dielectric may be removed by a chemical mechanical planarization (CMP) process that stops on the hardmask layer 204, leaving first STI structures 502.

CMP is performed using, e.g., a chemical or granular slurry and mechanical force to gradually remove upper layers of the device. The slurry may be formulated to be unable to dissolve, for example, the hardmask layer 204, resulting in the CMP process's inability to proceed any farther than that layer.

Referring now to FIG. 6, a cross-sectional view of a step in the fabrication of a semiconductor device is shown. The stack 202 is split into two device stacks 604 by forming a gap 602 in the middle of the stack 202. The gap 602 may be formed by photolithographically forming a pattern over the hardmask layer 204 and then anisotropically etching down into the stack 202 using one or more RIE processes. The etch may be timed to stop in the remaining portion of the first sacrificial layer 108, or may formulated to selectively stop on that layer.

Figure 7:
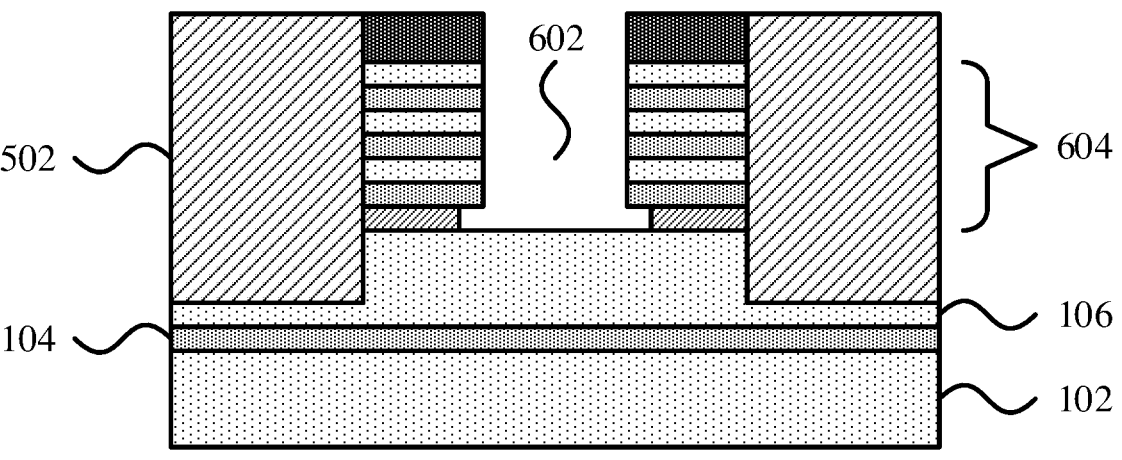
FIG. 7 is a cross-sectional view of a step in the fabrication of a semiconductor device with an enlarged STI structure, showing the removal of the remainder of the bottommost semiconductor layer, in accordance with an embodiment of the present invention.

Referring now to FIG. 7, a cross-sectional view of a step in the fabrication of a semiconductor device is shown. The remaining portion of the first sacrificial layer 108 is selectively etched away, leaving an undercut gap underneath the stacks 604.

Figure 8:
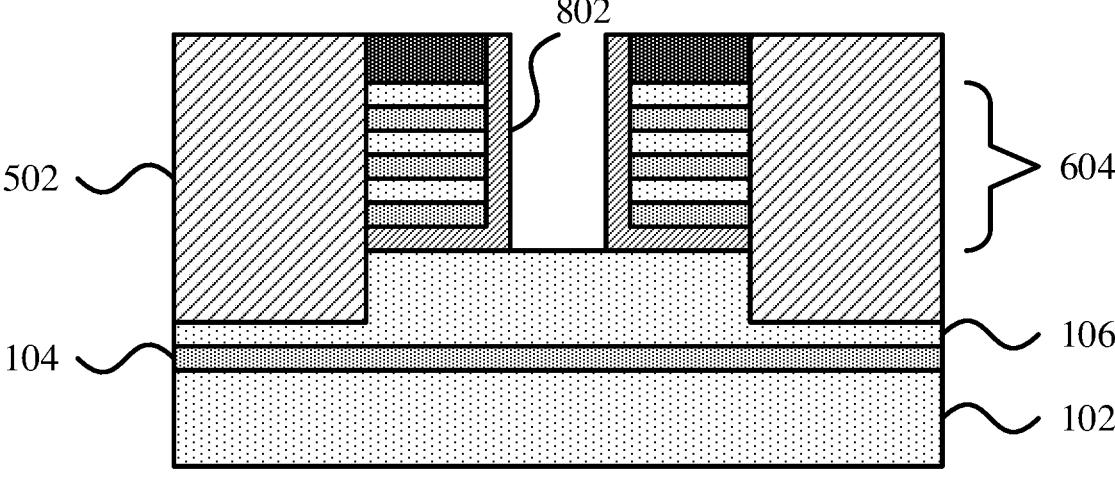
FIG. 8 is a cross-sectional view of a step in the fabrication of a semiconductor device with an enlarged STI structure, showing the formation of a dielectric liner on exposed sidewalls of the first device region and the second device region, in accordance with an embodiment of the present invention.

Referring now to FIG. 8, a cross-sectional view of a step in the fabrication of a semiconductor device is shown. The bottom dielectric 402 is extended to form dielectric liner 802, for example by conformally depositing a dielectric material and then selectively and anisotropically etching away the dielectric material from exposed horizontal surfaces.

Figure 9:
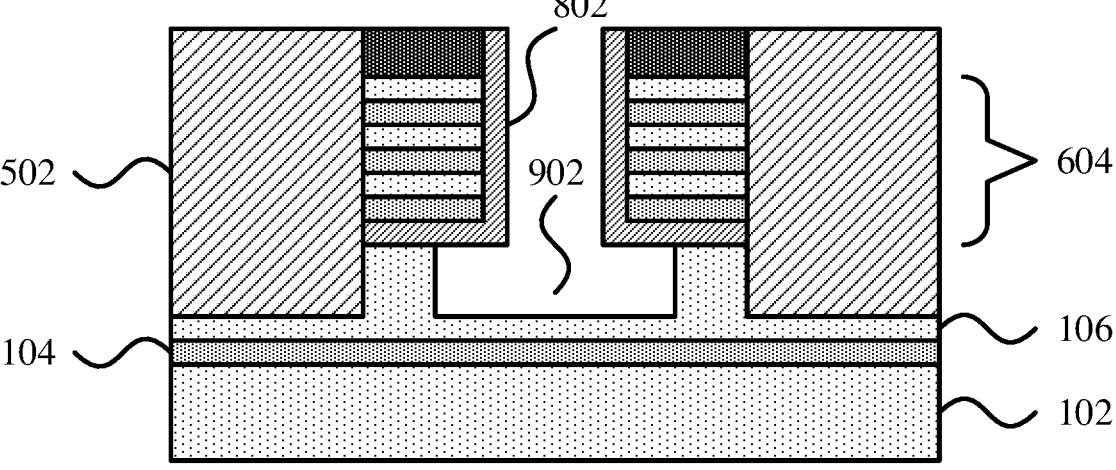
FIG. 9 is a cross-sectional view of a step in the fabrication of a semiconductor device with an enlarged STI structure, showing the formation of a cavity between the first device region and the second device region and that laterally extends underneath the first device region and the second device region, in accordance with an embodiment of the present invention.

Referring now to FIG. 9, a cross-sectional view of a step in the fabrication of a semiconductor device is shown. A cavity 902 is formed between and underneath the device stacks 604. The cavity 902 may be formed by first performing an anisotropic etch that selectively removes semiconductor material from the device substrate 106, followed by a selective isotropic etch that laterally removes material from the device substrate 106 and undercuts the device stacks 604. In some embodiments, the cavity 902 may be formed by performing a single isotropic etch, without performing a first anisotropic etch.

Figures 10, 11, 12:
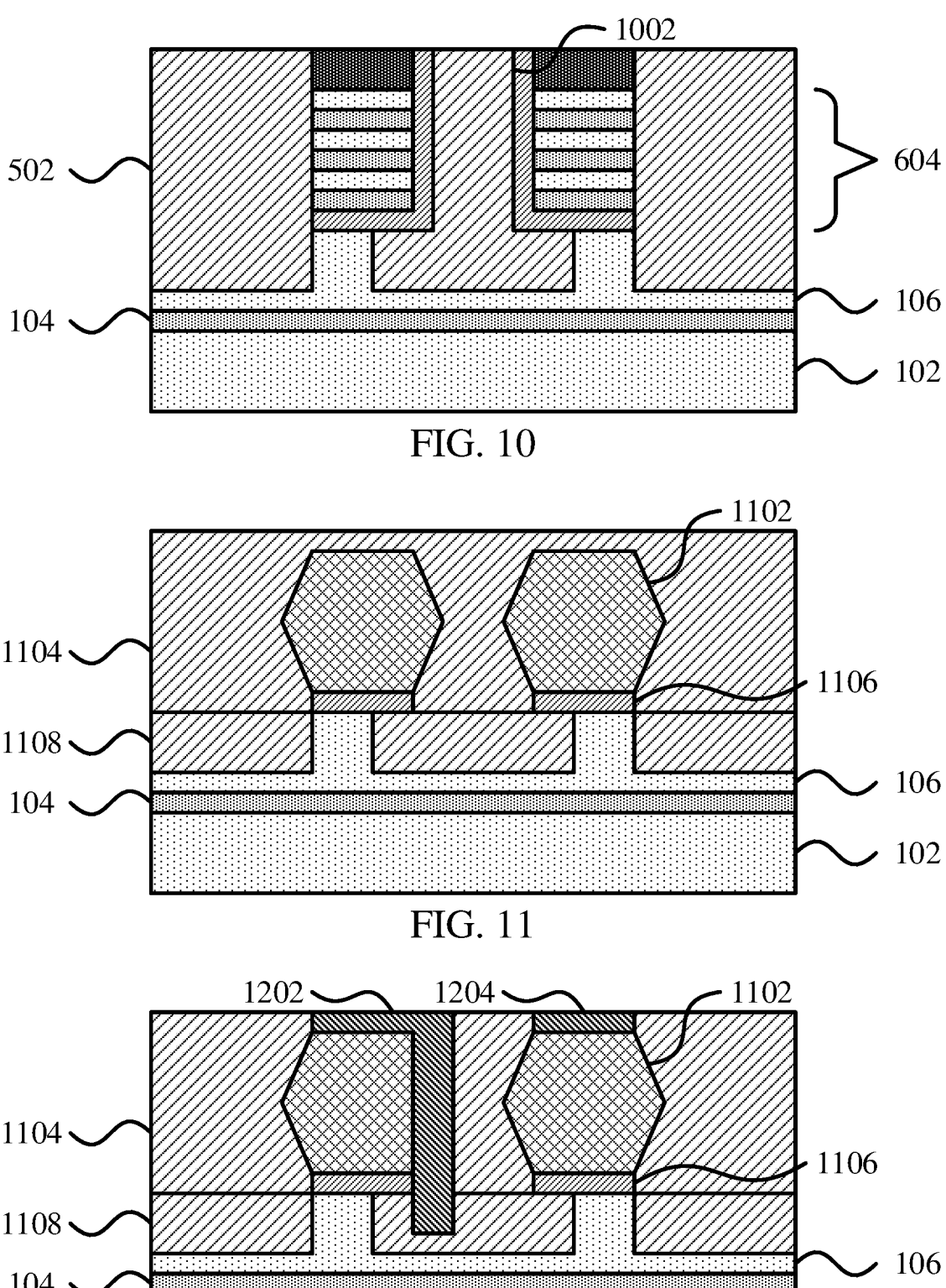
FIG. 10 is a cross-sectional view of a step in the fabrication of a semiconductor device with an enlarged STI structure, showing the formation of dielectric structure in the cavity, between the first device region and the second device region, in accordance with an embodiment of the present invention.
FIG. 11 is a cross-sectional view of a step in the fabrication of a semiconductor device with an enlarged STI structure, showing the formation of source/drain structures in the first device region and the second device region, in accordance with an embodiment of the present invention.
FIG. 12 is a cross-sectional view of a step in the fabrication of a semiconductor device with an enlarged STI structure, showing the formation of a conductive via that makes contact with one of the source/drain structures and that extends down into the dielectric structure, in accordance with an embodiment of the present invention.

Referring now to FIG. 10, a cross-sectional view of a step in the fabrication of a semiconductor device is shown. The cavity 902 and the gap 602 are filled with dielectric material using any appropriate process, such as a flowable CVD of silicon dioxide, to form a second STI structure 1002. Because the cavity was enlarged laterally, the second STI structure 1002 is wider than it would have been otherwise, providing superior isolation between the two device regions.

Referring now to FIG. 11, a cross-sectional view of a step in the fabrication of a semiconductor device is shown. This step shows the device after processing has formed transistors using the device stacks 604, establishing a FEOL layer. In particular, source/drain structures 1102 may be grown from exposed surfaces of the channel layers 112. The second sacrificial layers 110 may be etched away to expose top and bottom surfaces of the channel layers 112, and a gate stack (not shown) may be formed on and around the channel layers 112. The STI structures 502/1002 may be etched back to the height of the device substrate 106 and a bottom dielectric isolation (BDI) layer 1106, left over from the dielectric liner 802, may separate the devices from the device substrate 106. STI structures 1108 may remain between device regions, separating the remaining portions of the device substrate beneath the BDI layer 1106.

The source/drain structures 1102 may be formed by epitaxial growth and may include a doped semiconductor material, for example including a p-type dopant or an n-type dopant. The dopant may be added in situ during the growth process or may be implanted afterward using an ion bombardment process. In some embodiments, the two FEOL devices may be formed as different device polarities, for example with one being formed as a p-type FET and the other being formed as an n-type FET. An interlayer dielectric 1104 is deposited over and around the source/drain structures 1102, for example using a flowable CVD of silicon dioxide.

Referring now to FIG. 12, a cross-sectional view of a step in the fabrication of a semiconductor device is shown. The interlayer dielectric 1104 is patterned to expose the source/drain structures 1102, including a region that exposes a top surface of a source/drain structure 1102 and a region that additionally etches down deeper into the interlayer dielectric 1104. These volumes are filled with conductive material using any appropriate deposition process, forming top contact 1204 and top/side contact 1202. The contacts may be formed using appropriate conductive metal such as, e.g., tungsten, nickel, titanium, molybdenum, tantalum, copper, platinum, silver, gold, ruthenium, iridium, rhenium, rhodium, cobalt, and alloys thereof.

Figures 13, 14, 15:
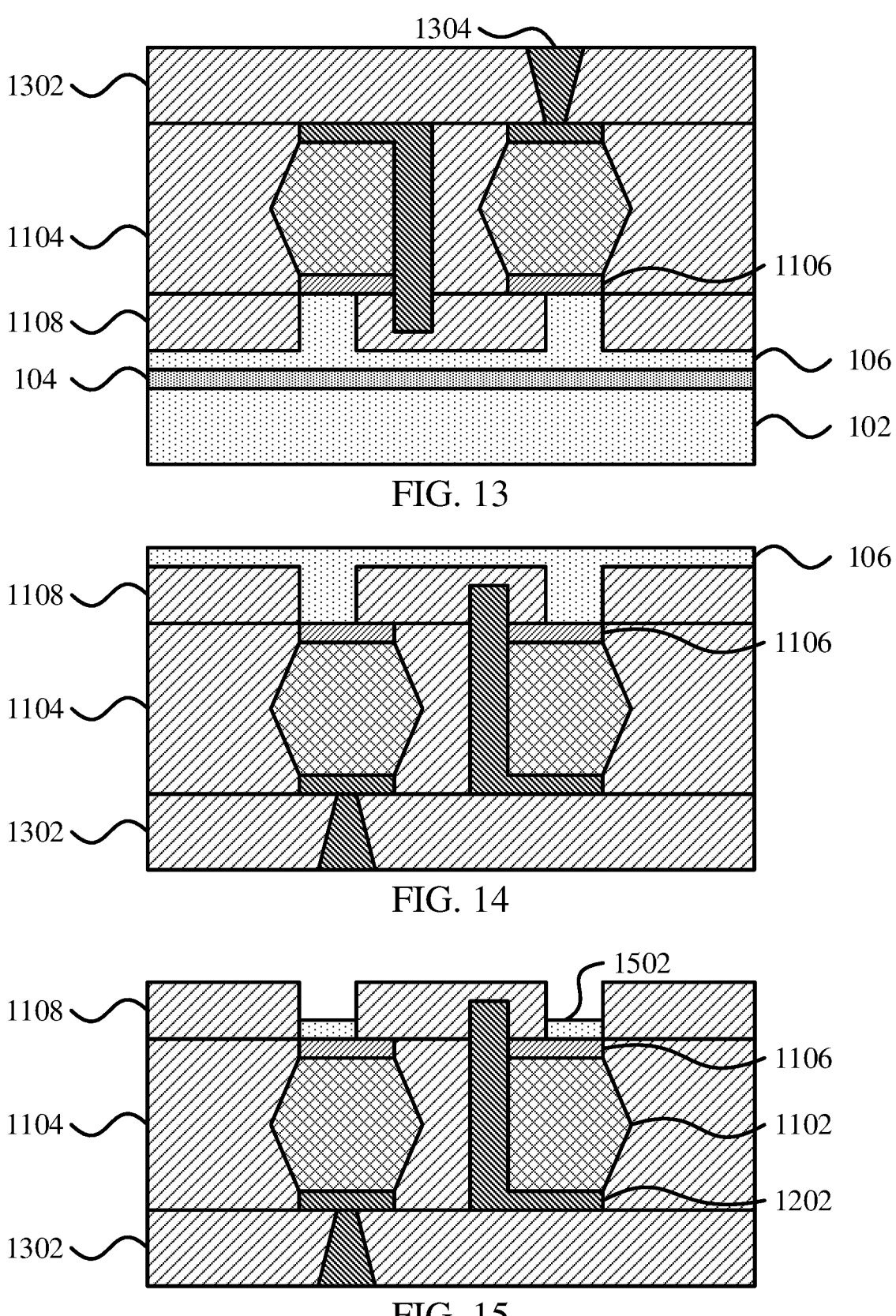
FIG. 13 is a cross-sectional view of a step in the fabrication of a semiconductor device with an enlarged STI structure, showing the formation of a back-end-of-line layer over the first device region and the second device region, with a conductive via to one of the source/drain structures, in accordance with an embodiment of the present invention.
FIG. 14 is a cross-sectional view of a step in the fabrication of a semiconductor device with an enlarged STI structure, showing the removal of substrate layers, in accordance with an embodiment of the present invention.
FIG. 15 is a cross-sectional view of a step in the fabrication of a semiconductor device with an enlarged STI structure, showing the recess of a semiconductor layer underneath the first device region and the second device region, in accordance with an embodiment of the present invention.

Referring now to FIG. 13, a cross-sectional view of a step in the fabrication of a semiconductor device is shown. Back-end-of-line (BEOL) layers 1302 are formed on the FEOL layer, for example by depositing a layer of dielectric material on the interlayer dielectric 1104 and forming conductive structures 1304 therewithin. Such conductive structures may include vias and conductive lines to carry power and signal information, and multiple such BEOL layers may be formed, with the vias providing interconnection between the BEOL layers and between the BEOL layers and the FEOL layer.

Referring now to FIG. 14, a cross-sectional view of a step in the fabrication of a semiconductor device is shown. A carrier wafer (not shown) may be bonded to the BEOL layers 1302. The carrier wafer may be attached using an oxide layer or any appropriate adhesive, and may be used to move and flip the wafer to expose the underside of the bulk substrate 102. This view therefore shows the wafer as being turned upside-down.

The bulk substrate 102 may be removed, for example using a selective etch or CMP that stops on etch stop layer 104. The etch stop layer 104 may then be removed, for example using a selective etch or CMP that stops on the device substrate 106, thereby exposing the device substrate 106.

Referring now to FIG. 15, a cross-sectional view of a step in the fabrication of a semiconductor device is shown. The device substrate 106 is recessed, for example using any appropriate selective isotropic or anisotropic etch. The etch may be timed to leave substrate remnants 1502 in contact with the BDI layer 1106. Leaving the remnants 1502 prevents the etch from causing damage to the source/drain structures 1102, to the gate dielectric (not shown), the and to the contacts and vias 1202.

Figure 16:
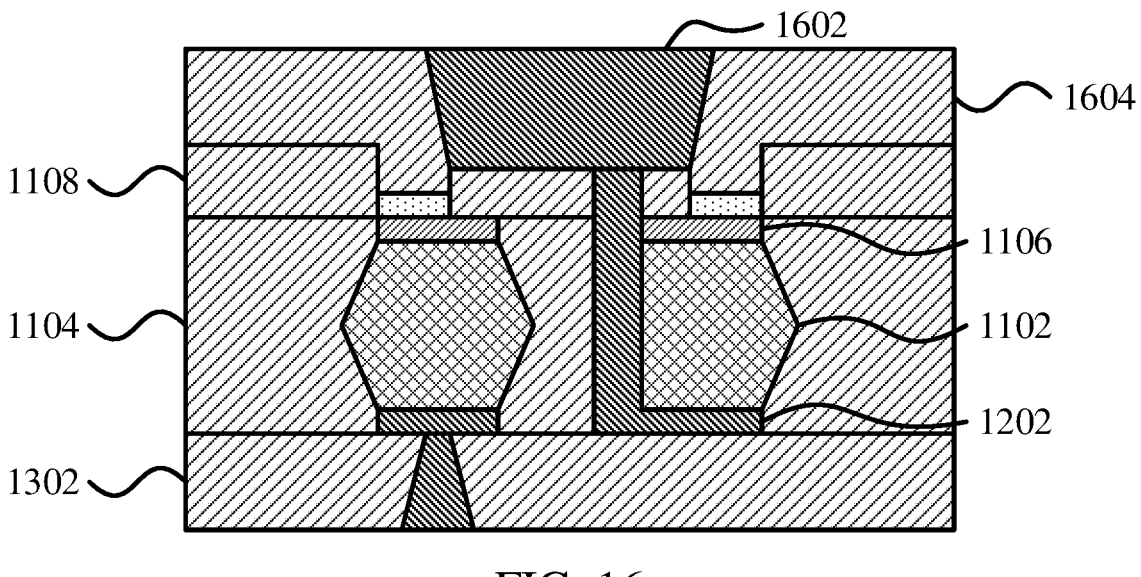
FIG. 16 is a cross-sectional view of a step in the fabrication of a semiconductor device with an enlarged STI structure, showing the formation of a buried power rail underneath the first device region and the second device region, making contact with the conductive via, in accordance with an embodiment of the present invention.

Referring now to FIG. 16, a cross-sectional view of a step in the fabrication of a semiconductor device is shown. A backside power distribution layer 1604 is formed on the backside of the FEOL layer, including deposition of a dielectric layer and the formation of a backside power rail 1602. The backside power rail 1602 may be formed by, for example, patterning a trench in the dielectric layer and depositing any appropriate conductive material using any appropriate deposition process. The backside power rail 1602 may contact contacts/vias 1202, providing electrical power to devices in the FEOL layer.

Additional backside layers may be formed on the backside power distribution layer 1604, for example by depositing additional layers of dielectric material and forming conductive structures within the additional layers of dielectric material. As with the BEOL layers, vias may be used to provide electrical contacts between the layers. These backside layers may be used to form a backside power distribution network to service the devices of the FEOL layer.

Referring now to FIG. 17, a method of forming a semiconductor device is shown. Block 1702 forms first semiconductor layer 108 and alternating second semiconductor layers 110 and channel layers 112. Block 1704 etches the layers into stacks 202, for example by patterning a hardmask layer 204 using a photolithographic patterning process and then anisotropically etching the semiconductor layers around the hardmask layer 204.

Block 1706 recesses the first sacrificial layer 108 underneath the stack 202, for example using a selective, isotropic etch. Block 1708 then fills the recesses with dielectric material, for example using a conformal deposition of silicon nitride, followed by a selective etch to remove any such material that is exposed outside the recesses.

Block 1710 splits the stack 202 into device stacks 604, creating a gap 602 between the device stacks 604. This may be performed by creating a photolithographic pattern over the stack 202 and then anisotropically etching down to the first sacrificial layer 108. Block 1712 may then form a dielectric liner 802, for example by selectively etching away remnants of the first sacrificial layer 108, conformally depositing the dielectric material, and then selectively and anisotropically etching away such dielectric material from horizontal surfaces.

Block 1714 etches down into the device substrate 106, for example using a selective anisotropic etch. The etch may be timed to stop at an appropriate depth within the device substrate 106. Block 1716 then opens up a cavity underneath the device stacks 106 using a selective isotropic etch to widen the etched region. Block 1718 forms an STI structure in the cavity using any appropriate deposition of dielectric material that will fill the cavity.

Block 1720 forms FEOL devices using the device stacks 604. This process may include, for example, forming inner spacers by recessing the second sacrificial layers 110 relative to the channel layers 112 followed by an oxidation process. Source/drain structures 1102 may be epitaxially grown from the exposed end surfaces of the channel layers 112 and interlayer dielectric 1104 may be deposited. The second sacrificial layers 110 may be etched away to expose the surfaces of the channel layers 112 and a gate stack may be formed thereon.

Block 1722 forms contacts and backside vias 1202 my etching into the interlayer dielectric 1104 and depositing conductive material. The etch may reach down past the FEOL devices and into the STI layer 1108, so that the backside via extends to a depth below the FEOL devices. Block 1724 forms BEOL layers 1302 on the FEOL layer, for example depositing dielectric material and then forming conductive structures therewithin, such as conductive lines and vias, which may connect to the contacts of the FEOL layer.

Block 1726 recesses the device substrate 106. In embodiments where a bulk substrate 102 is separated from the device substrate 106 by etch stop layer 104, this may first include removal of the bulk substrate 102 and the etch stop layer 104 to expose the surface of the device substrate 106. Recessing the device substrate 106 may include performing a timed etch that leaves behind a remnant 1502. Block 1728 forms backside power rail 1602 by, e.g., forming a backside power distribution layer 1604 from any appropriate dielectric material and then forming conductive structures therewithin.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of enlarged shallow trench isolation for backside power (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a first semiconductor device in a first device region;
a second semiconductor device in a second device region;

a dielectric structure between the first device region and the second device region, which laterally extends part way underneath the first semiconductor device and the second semiconductor device;

a first dielectric layer between the dielectric structure and the first semiconductor device, having an 'L'-shaped cross-section;

a buried power rail under the dielectric structure; and a conductive via that penetrates the dielectric structure to connect the first semiconductor device to the buried power rail.

2. The semiconductor device of claim 1, further comprising a second dielectric layer between the dielectric structure and the second semiconductor device.

3. The semiconductor device of claim 2, wherein the dielectric layer and the dielectric structure are formed from different dielectric materials.

4. The semiconductor device of claim 2, further comprising a layer of semiconductor material under the dielectric layer.

5. The semiconductor device of claim 4, wherein the layer of semiconductor material has a first edge that aligns with an edge of a channel layer of the first semiconductor device and has an opposite second edge that does not align with an edge of the channel layer of the first semiconductor device.

6. The semiconductor device of claim 5, wherein the dielectric structure is between the layer of semiconductor material and the conductive via.

7. The semiconductor device of claim 1, wherein the conductive via extends to a height above the first semiconductor device and makes electrical contact with a top and side surface of a source/drain structure of the first semiconductor device.

8. The semiconductor device of claim 1, further comprising:

back-end-of-line layers over the first semiconductor device and the second semiconductor device; and a backside power distribution network under the buried power rail.

9. The semiconductor device of claim 1, wherein the first dielectric layer is on a first side surface of the first semiconductor device and not on a second side surface of the first semiconductor device, opposite to the first side surface.

10. The semiconductor device of claim 1, further comprising a shallow trench isolation structure on a side surface of the first dielectric device opposite to the first dielectric layer, the shallow trench isolation structure being in direct contact with the first semiconductor device.

11. A semiconductor device, comprising:

a first semiconductor device in a first device region;

a second semiconductor device in a second device region;

a dielectric structure between the first device region and the second device region, which laterally extends part way underneath the first semiconductor device and the second semiconductor device;

a first dielectric layer between the dielectric structure and the first semiconductor device, having an 'L'-shaped cross-section;

a buried power rail under the dielectric structure;

a conductive via that penetrates the dielectric structure to connect the first semiconductor device to the buried power rail; and a back-end-of-line layer over the first semiconductor device and the second semiconductor device that includes a conductive via to connect to the second semiconductor device.

12. The semiconductor device of claim 11, further comprising a dielectric second layer between the dielectric structure and the second semiconductor device.

13. The semiconductor device of claim 12, wherein the dielectric layer and the dielectric structure are formed from different dielectric materials.

14. The semiconductor device of claim 12, further comprising a layer of semiconductor material under the dielectric layer.

15. The semiconductor device of claim 14, wherein the layer of semiconductor material has a first edge that aligns with an edge of a channel layer of the first semiconductor device and has an opposite second edge that does not align with an edge of the channel layer of the first semiconductor device.

16. The semiconductor device of claim 15, wherein the dielectric structure is between the layer of semiconductor material and the conductive via.

17. The semiconductor device of claim 11, wherein the conductive via extends to a height above the first semiconductor device and makes electrical contact with a top and side surface of a source/drain structure of the first semiconductor device.

* * * * *